March 14, 1961 L. D. ARMSTRONG 2,975,080

PRODUCTION OF CONTROLLED P-N JUNCTIONS

Filed Dec. 24, 1958 2 Sheets-Sheet 1

INVENTOR.
LORNE D. ARMSTRONG

BY

W. S. Hill

AGENT

March 14, 1961 L. D. ARMSTRONG 2,975,080

PRODUCTION OF CONTROLLED P-N JUNCTIONS

Filed Dec. 24, 1958

2 Sheets-Sheet 2

INVENTOR.
LORNE D. ARMSTRONG
BY
W.S. Hill
AGENT

United States Patent Office 2,975,080
Patented Mar. 14, 1961

2,975,080

PRODUCTION OF CONTROLLED P-N JUNCTIONS

Lorne D. Armstrong, Somerville, N.J., assignor to Radio Corporation of America, a corporation of Delaware Filed Dec. 24, 1958, Ser. No. 782,874
11 Claims. (Cl. 148—1.5)

This invention relates to an improved method of making semiconductor devices. More particularly, the invention relates to an improved method of controlling the size and shape of rectifying barriers in bodies of semiconductive materials.

Junction type semiconductor devices have been made by heating a given conductivity type semiconductive body in a liquid or gaseous ambient containing a type-determining substance capable of imparting opposite conductivity type to the particular semiconductor employed. The type-determining substance, known in the art as an impurity, diffuses from the fluid ambient into the body to a depth determined by the heating profile and the diffusion constant of the impurity in the semiconductor. Since a surface layer of the semiconductive body or wafer is thereby suffused with the impurity, a rectifying barrier known as a PN junction is formed at the interface between the given conductivity type bulk of the wafer and the wafer surface layer, which has been converted to opposite conductivity type by the type-determining substance diffused therein. The rectifying barrier thus produced extends over the entire surface of the wafer. However, in the fabrication of semiconductor devices such as transistors, diodes and the like, it is necessary to control the size and shape of the rectifying barriers formed in the semiconductive wafer. Such control is difficult to attain with precision.

It is therefore an object of this invention to provide an improved method of fabricating semiconductor devices.

Another object of the invention is to provide an improved method of introducing rectifying barriers in semiconductive wafers.

Yet another object is to provide an improved method of diffusing a type-determining substance into a semiconductive wafer.

Still another object is to provide an improved method of controlling the size and shape of rectifying barriers in semiconductor devices.

These and other objects are accomplished by the method of the instant invention, which comprises the steps of converting a thin surface layer of a given conductivity type semiconductor wafer to the opposite conductivity type, and then removing predetermined portions of the converted layer. Subsequently, the wafer is heated so as to diffuse type-determining material from the remaining portions of said converted layer into the wafer. According to one important embodiment of the invention, this heating step is performed in an ambient including a substance capable of imparting given conductivity type to the given conductivity type semiconductor wafer.

Figure 1A:
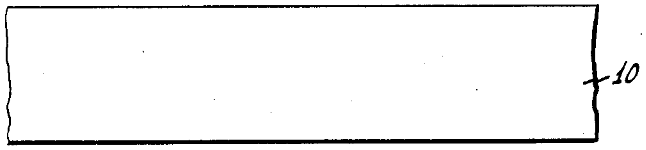
Figure 1B:
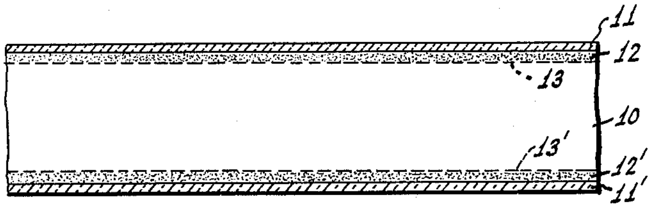
Figure 1C:
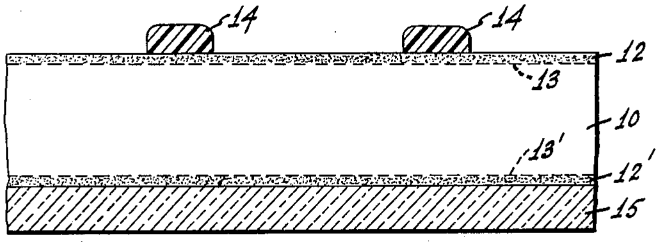
Figure 1D:
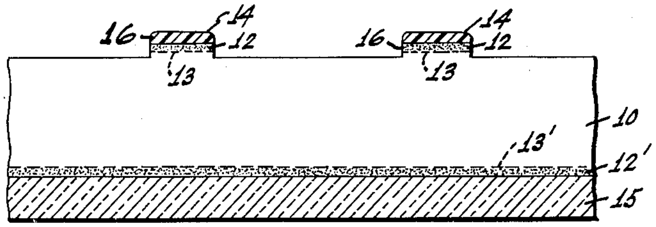
Figure 1E:
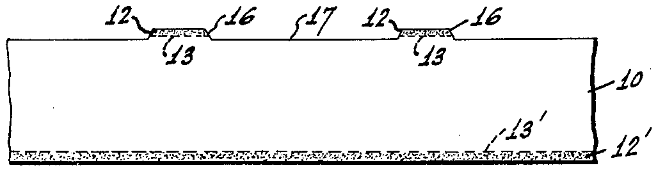
Figure 1F:
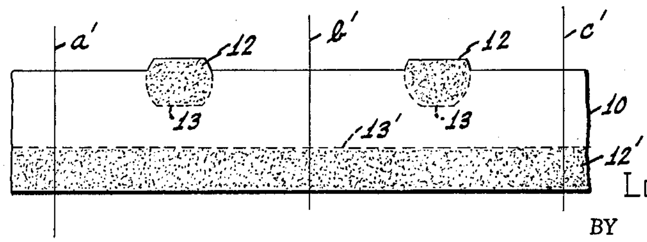
Figure 2:
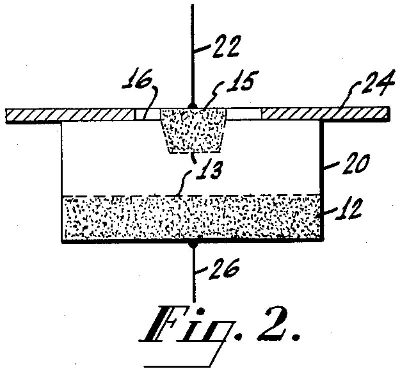

The invention and its features and advantages will be described in greater detail with reference to the accompanying drawing, in which:

Figures 1*a*–1*f* illustrate successive steps in the fabrication of a semiconductive device made in accordance with the present invention;

Figure 2 is a cross-sectional view of the completed device made according to the method of Figure 1; and, Figures 3*a*–3*f* are cross-sectional views of another method of fabricating a semiconductor device in accordance with the instant invention.

Similar reference numerals have been applied to similar elements throughout the drawing.

A preferred example of the method will illustrate the preparation of a double-junction transistor device of the triode type in accordance with the invention. However, it is to be understood that the method is equally applicable to the fabrication of other junction devices, such as tetrodes, diodes, and the like.

*Example I*

Referring to Figure 1*a*, a wafer or body 10 of semiconductive material of either conductivity type is prepared by conventional methods. For example, a monocrystalline ingot is formed of highly purified silicon. The ingot is cut into transverse slices, and the slices are lapped, then etched in a mixture of hydrofluoric and nitric acids to reduce them to the desired thickness. The exact area of the resulting wafer is not critical, although the number of units made from each slice depends on its area. In this example, the slice 10 is made of P-conductivity type silicon, 10 mils thick, and has a resistivity of about 3–10 ohm centimeters.

Referring to Figure 1*b*, the slice 10 is heated in the vapors of ammonium phosphate so that a glassy phosphorus-containing film or coating 11 and 11' is formed over each major surface of the water. Simultaneously, some phosphorus diffuses from the glassy phosphorus-containing film or deposits 11 and 11' into the slice 10, forming a phosphorus-diffused surface layer or region 12 and 12' in the slice adjacent the surface coatings 11 and 11'. Sufficient phosphorus is thus diffused into the surface layer 12 and 12' to convert this region to N-conductivity type. A rectifying barrier 13 and 13' is thereby formed at the interface between the N-type surface layer 12 and 12' and the P-type bulk of the slice 10. In this example, the slice 10 is heated in ammonium phosphate vapors for about 30 minutes at about 1200° C. Under these conditions, the converted phosphorus-diffused surface layer 12 and 12' is about 0.25 mil thick.

Referring to Figure 1*c*, the slice 10 is treated with hydrofluoric acid to remove the glassy phosphorus-containing film 11 and 11'. In this example, the wafer is immersed in concentrated hydrofluoric acid (48%) for about 1 minute. This treatment removes the phosphorus-containing coating or glaze 11 and 11', but hydrofluoric acid alone does not appreciably etch the silicon wafer 10.

Predetermined portions of at least one major surface of the slice 10 are then masked by means of an acid-resist, such as paraffin wax or the like. In this example, a perforated metal mask (not shown) is placed on one converted surface layer 12, and a solution of Apiezon wax dissolved in carbon tetrachloride is sprayed over the mask, leaving wax dots 14 on the exposed portions of the surface layer 12 after removal of the mask. The slice is then waxed down on a glass slide 15, so that the surface bearing the wax dots 14 is uppermost.

Referring to Figure 1*d*, the slice 10 is treated for about ½ minute in a mixture of concentrated hydrofluoric and nitric acids. The mixture is composed of one volume hydrofluoric acid and 4 volumes nitric acid. Under these conditions, the etchant will dissolve about ⅓ mil of those portions of the silicon slice 10 not protected by the waxed dots 14. Since the converted phosphorus-diffused surface layer 12 is only ¼ mil thick, it is entirely removed and the P-type bulk of the wafer is exposed, except for those portions 16 of the surface layer 12 protected by the waxed dots 14. The opposite phosphorus-diffused surface layer 12′ is protected from the action of the etchant by the glass slide 15.

Referring to Figure 1*e*, the waxed dots 14 are removed by washing the slice 10 several times in a solvent such as carbon tetrachloride, and the silicon slice is removed from the glass slide 15. The treated face of the slice 10 now contains at least one mesa or raised portion 16, which corresponds in size and shape to the waxed dots 14 previously deposited on the slice. Each mesa 16 consists of phosphorus-diffused N-conductivity type material which is the remainder of surface layer 12, and includes a rectifying barrier 13 between this remaining portion of the N-type surface layer 12 and the P-type bulk of the slice 10. Between the mesas 16 there is exposed a P-type surface 17 of the original wafer material.

Referring to Figure 1*f*, the slice 10 is reheated so as to diffuse phosphorus from the remaining portions of the converted surface layer 12 within each mesa 16 into the slice. The opposite surface layer 12′ is deepened simultaneously. In accordance with one important embodiment of the invention, this heating step is performed in an ambient including a substance capable of imparting to the semiconductor slice 10 its original conductivity type. In this example, since the slice 10 was originally P-conductivity type, the ambient utilized contains an acceptor. Boron is a suitable acceptor in silicon. The slice 10 is placed in a boat, which may, for example, be fused quartz, and is heated in an atmosphere containing boron trioxide for about 8 hours at about 1300° C. Sufficient boron trioxide is utilized so that the P-type surfaces 17 of the wafer attain an acceptor concentration of about $10^{18}$ to $10^{19}$ per cubic centimeter. This concentration is controlled by the temperature of the boron trioxide, the rate of flow of carrier gas through the tube, and the amount of boron trioxide utilized. However, the amount of boron that diffuses into the wafer under these conditions is not sufficient to alter the conductivity type of each mesa 16, which is so heavily diffused with phosphorus as to remain N-type even in an atmosphere containing this amount of an acceptor.

The acceptor present in the ambient during this step has a two-fold effect: first, it tends to prevent diffusion of the phosphorus donor atoms from each measa 16 laterally over the P-type surface 17 of the slice, and thereby promotes a flat diffusion front for the phosphorus over the area of the mesa; second, it decreases the resistivity of the P-type surface 17. Since the base connection of the triode is subsequently made to the P-type surface 17, the increased conductivity of this surface makes it easier to fabricate an ohmic base contact, and reduces the base resistance of the device.

During this heating step phosphorus diffuses from each mesa 16 into the slice, and also from the opposite surface layer 12′ into the slice, so that the distance between the opposing rectifying barriers 13 and 13′ is reduced. To complete the device, the slice 10 is diced along the planes *a′—a′*, *b′—b′*, and *c′—c′*, forming individual units as illustrated in Figure 2.

Referring now to Figure 2, the individual unit 20 is completed by attaching an emitter lead 22 to the mesa 16, a base tab 24 to the P-type surface 17 surrounding the mesa 16, and a collector lead 26 to the opposite major face. Such leads may be conveniently attached by nickel plating the desired areas of the unit, and soldering platinum wires to the plated areas. The device is then encapsulated and cased by conventional methods known to the art.

While the device thus prepared is a bipolar triode transistor, it will be understood by those skilled in the art that the invention may also be utilized to fabricate diodes, unipolar devices, tetrodes, and other multiple junction devices. In the above example, P-type silicon was used as the starting material, but this was by way of illustration only, and not as a limitation. The conductivity types of the different regions may be readily interchanged if desired. Thus it is equally feasible to begin with an N-type silicon slice, and deposit an acceptor upon it so as to convert a surface layer thereof to P-conductivity type, for example by heating the slice in an ambient containing boron trioxide. Thereafter portions of the surface layer are protected with an acid-resist such as wax, the unprotected portions of the surface layer removed by an etchant, and the slice subsequently heated in an ambient containing a donor, which may for example be phosphorus.

In another embodiment of the invention, the phosphorus glaze 11 and 11′ is not removed in the step corresponding to Figure 1*c*. Instead, the wax dots 14 are deposited directly on the glassy phosphorus-containing film 11. When the semiconductor slice is subsequently etched, the unprotected portions of the film 11 and the surface layer 12 are removed, leaving a portion of the film 11 in each mesa 16 directly beneath the wax dots 14. Thus, more phosphorus is available when the slice is subsequently heated to deepen the phosphorus-diffused layers.

Other methods may be utilized to form a surface layer of one conductivity type in a semiconductive wafer of the opposite type. For example, the given conductivity type semiconductor wafer may be immersed in a powder consisting of an alloy or mixture of the pure semiconductor and a type-determining material which induces opposite conductivity type in the semiconductor. The method is illustrated in Figure 3, and will be explained by another example.

*Example II*

Figure 3A:
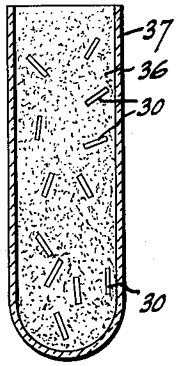
Figure 3B:
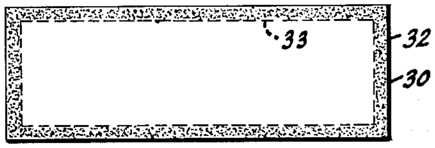

Referring to Figure 3*a*, a powder 36 is prepared by comminuting an alloy of a semiconductor and a donor. In this example, the powder 36 is made by crushing an alloy of 99% germanium-1% arsenic by weight. The powder 36 is loaded into an open tube or vessel 37, which may be fused quartz, Vycor, or the like. One or more P-conductivity type germanium pellets or wafers 30 are immersed in the powder 36, and the vessel 37 is then heated in a hydrogen furnace (not shown) at about 850° C. for about 15 minutes. During this step sufficient arsenic diffuses from the powder 36 into each wafer 30 to convert a surface layer 32 thereof about ⅓ mil thick to N-conductivity type, as shown in Figure 3*b*. A rectifying barrier or PN junction 33 is formed at the interface between the arsenic-diffused surface layer 32 and the P-type bulk of the wafer 30.

Figure 3C:
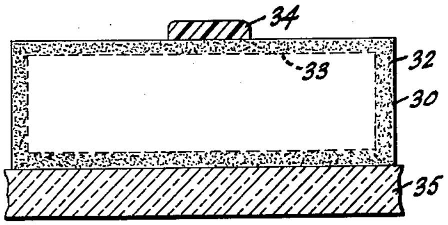
Figure 3D:
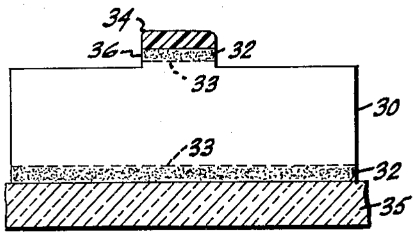

Next a wax dot 34 is deposited on a predetermined area of one major wafer face, as shown in Figure 3*c*. The opposite wafer face is waxed down on a glass slide 35, and the wafer is treated in a hydrofluoric acid-nitric acid etchant for about 1 minute. Under these conditions, a layer about ½ mil thick is removed from the wafer, leaving a mesa 36 beneath the waxed dots 34, as illustrated in Figure 3*d*. The mesa 36 contains a portion of the arsenic-diffused surface layer 32 and the PN junction 33. The opposite face of the wafer 30 is protected by the glass slide 35 from the action of the etchant. The ends of the wafer 30 are then removed by an ultrasonic cutting tool.

Figure 3E:
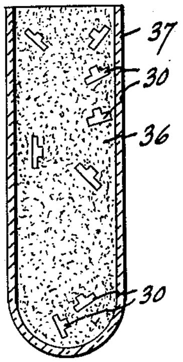
Figure 3F:
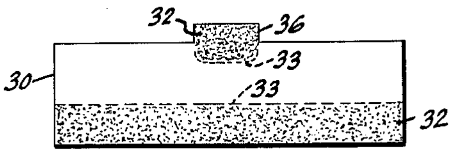

Referring to Figure 3*e*, the waxed dot 34 is dissolved in carbon tetrachloride, and the wafer 30 is removed from the glass slide 35. One or more wafers 30 are then heated while immersed in a powder 38 made by pulverizing an alloy of 99.99% germanium and .01% indium. Heating is performed in a reducing ambient for 2 hours at 850° C., so that the arsenic-diffused layer 32 is thickened to a total depth of about 1.2 mils. The indium present increases the conductivity of the P-type surface layer, but is not sufficient to alter the N-type conductivity of the mesa. It will be recognized that the resulting structure shown in Figure 3*f* is similar to that shown in Figure 1*f*. The unit is then completed by attaching emitter, base and collector leads as in Figure 2, next encapsulating and casing the unit, using conventional methods known to the art.

It will be understood that the various conductivity types in the above example may be reversed if desired. The device illustrated in Figure 3 is of NPN type, but PNP units may be readily made in an analogous manner. An N-type germanium wafer is used as the starting material, and the wafer is heated at 850° C. for about 3 hours in a powder consisting of crushed germanium with .1% gallium. A gallium-diffused P-conductivity type surface layer is thereby formed over the wafer. Thereafter selected portions of the wafer surface are protected by waxed dots, and the remaining portion of the surface layer is removed, leaving a mesa beneath each waxed dot. The rest of the process is similar to that described above, using, for example, a powder of germanium with .01% arsenic to control the surface resistivity of the exposed bulk material.

Other donors and acceptors may be appropriately utilized, and other variations may be made without departing from the spirit and scope of the invention. For example, the heavily diffused surface layers in Example I and Example II may be formed by diffusion from a liquid source, instead of a vapor or powder source. Other techniques, such as grinding wheels, may be used to remove predetermined portions of the aforesaid diffused surface layers. A photo-resist may be utilized instead of the acid-resist to mask selected portions of the diffused surface layer. The diffused wafer, for example N-type germanium with a gallium-diffused P-type surface layer, is covered with a layer of photo-resist, and predetermined portions of the layer are exposed to light. The photoresist is then developed, and the unexposed portion removed. Those portions of the gallium-diffused surface layer not covered by the photo-resist are then removed, and the wafer is subsequently heated while immersed in a powder consisting of germanium and a donor. If desired, the reheating step which deepens the surface layer may be performed in vacuum, or in an inert ambient, instead of a reducing ambient.

What is claimed is:

1. The method of fabricating a semiconductive device comprising the steps of converting a thin surface layer of a given conductivity type semiconductor wafer to the opposite conductivity type, removing predetermined portions of said converted layer, and heating said wafer so as to diffuse type-determining material from the remaining portions of said converted layer into said wafer, said heating being performed in an ambient including a substance capable of imparting said given conductivity type to said wafer, the amount of said substance which diffuses into said wafer being insufficient to alter the conductivity type of said surface layer.

2. The method of fabricating a semiconductive device comprising the steps of coating a given conductivity type semiconductor wafer with a film of opposite conductivity type-determining material so as to produce a surface layer containing said material, depositing an inert masking material on predetermined portions of said film, removing those portions of said film and the immediately adjacent surface layer of said wafer not covered by said masking material, removing the masking material, and heating said wafer so as to diffuse said type-determining material from the remaining portion of said surface layer and surface film into predetermined portions of said wafer, said heating being performed in an ambient including a substance capable of imparting said given conductivity type to said wafer, the amount of said substance which diffuses into said wafer being insufficient to alter the conductivity type of said surface layer.

3. The method of fabricating a semiconductive device comprising the steps of coating a given conductivity type semiconductor wafer with a film of opposite conductivity type-determining material so as to produce an opposite conductivity type surface layer on said wafer, removing said film, depositing an inert masking material on predetermined portions of said surface layer, removing those portions of said opposite conductivity type surface layer not covered by said masking material, removing said masking material, and heating said wafer so as to diffuse said opposite conductivity type-determining material from the remaining portion of said surface layer into portions of said wafer, said heating being performed in an ambient including a substance capable of imparting said given conductivity type to said wafer, the amount of said substance which diffuses into said wafer being insufficient to alter the conductivity type of said surface layer.

4. The method of fabricating a semiconductive device comprising the steps of coating a given conductivity type semiconductor wafer with a film of opposite conductivity type-determining material so as to produce a surface layer containing said material, depositing an acid-resist over predetermined portions of said film, removing those portions of said film and the immediately adjacent opposite conductivity type surface layer of said wafer not covered by said acid-resist, removing the remaining portions of said acid-resist and said film, and heating said wafer so as to diffuse said opposite conductivity type-determining material from the remaining portion of said surface layer into predetermined portions of said wafer, said heating being performed in an ambient including a substance capable of imparting said given conductivity type to said wafer, the amount of said substance which diffuses into said wafer being insufficient to alter the conductivity type of said surface layer.

5. The method of fabricating a PN junction device comprising the steps of coating a P-conductivity type monocrystalline silicon wafer with a film of donor-containing material so as to produce a surface layer containing said donor, depositing wax on predetermined portions of said film, removing those portions of said film and adjacent surface layer of said wafer not covered by said wax, removing said wax and the remaining portion of said film, and heating said wafer so as to diffuse said donor from the remaining portion of said surface layer into predetermined portions of said wafer, said heating being performed in an ambient including an acceptor, the amount of said acceptor which diffuses into said wafer being insufficient to alter the conductivity type of said surface layer.

6. The method of fabricating a PN junction device comprising the steps of coating a P-conductivity type monocrystalline silicon wafer with a film of phosphorus-containing material so as to form an N-conductivity type surface layer on said wafer, depositing wax on predetermined portions of said film, removing those portions of said film and said N-type surface layer not covered by said wax, removing said wax and the remaining portions of said film, and heating said wafer so as to diffuse phosphorus from the remaining portions of said layer into predetermined portions of said wafer, said heating being performed in an ambient including a substance which is an acceptor in silicon, the amount of said acceptor which diffuses into said wafer being insufficient to alter the conductivity type of said N-conductivity type surface layer.

7. The method of fabricating a PN junction device comprising the steps of coating an N-conductivity type monocrystalline silicon wafer with a film of acceptor-containing material so as to produce a surface layer containing said acceptor, depositing wax on predetermined portions of said film, removing those portions of said film and a surface layer of said wafer not covered by said wax, removing said wax and the remaining portions of said film, and heating said wafer so as to diffuse said acceptor from the remaining portion of said surface layer into predetermined portions of said wafer, said heating being performed in an ambient including a donor, the amount of said donor which diffuses into said wafer being insufficient to alter the conductivity type of said surface layer.

8. The meehod of fabricating a PN junction device comprising the steps of coating an N-conductivity type monocrystalline silicon wafer with a boron-containing film so as to form a P-conductivity type surface layer on said wafer, depositing wax on predetermined portions of said film, removing those portions of said film and said P-type surface layer not covered by said wax, removing said wax and the remaining portion of said film, and heating said wafer so as to diffuse boron from the remaining portion of said surface layer into predetermined portions of said wafer, said heating being performed in an ambient including a donor, the amount of said donor which diffuses into said wafer being insufficient to alter the conductivity type of said P-conductivity type surface layer.

9. The method of fabricating a PN junction device comprising the steps of heating a P-conductivity type silicon wafer at about 1000° C. to 1350° C. in vapors of ammonium phosphate so as to form a glassy phosphorus-containing film and an adjacent phosphorus-containing surface layer on said wafer, depositing wax on predetermined portions of said wafer, removing by means of an etchant those portions of said film and surface layer not covered by said wax, removing said wax and the remaining portion of said film, and heating said wafer at about 1000° C. to 1350° C. so as to diffuse phosphorus from the remaining portion of said surface layer into said wafer, said heating being performed in an ambient containing sufficient boron trioxide vapor to introduce about $10^{18}$ to $10^{19}$ atoms of boron per cubic centimeter in the surface of said wafer, the amount of boron atoms introduced in the surface of said wafer being insufficient to alter the conductivity type of said phosphorus-containing surface layer.

10. The method of fabricating a PN junction device comprising the steps of heating a semiconductor wafer of given conductivity type in a powder composed of said semiconductor and an opposite type-determining material so as to convert a surface layer of said wafer to said opposite conductivity type, depositing an inert masking material on predetermined portions of said wafer, removing those portions of said surface layer not covered by said masking material, and heating said wafer so as to diffuse said opposite type-determining material from the remaining portion of said surface layer into predetermined portions of said wafer, said heating being performed in an ambient including a substance capable of imparting said given conductivity type to said wafer, the amount of said substance which diffuses into said wafer being insufficient to alter the conductivity type of said surface layer.

11. The method of fabricating a PN junction device comprising the steps of heating a semiconductor wafer of given conductivity type in a powder composed of said semiconductor and an opposite type-determining material so as to convert a surface layer of said wafer to said opposite conductivity type, depositing an inert masking material on predetermined portions of said wafer, removing those portions of said surface layer not covered by said masking material, and heating said wafer so as to diffuse said opposite type-determining material from the remaining portion of said surface layer into predetermined portions of said wafer, said heating being performed while said wafer is immersed in a powder consisting of said semiconductor and a substance capable of imparting said given conductivity type to said wafer, the amount of said substance which diffuses into said wafer being insufficient to alter the conductivity type of said surface layer.

References Cited in the file of this patent

UNITED STATES PATENTS

| | | |
|---|---|---|
| 2,629,800 | Pearson | Feb. 24, 1953 |
| 2,695,852 | Sparks | Nov. 30, 1954 |
| 2,804,405 | Derick et al. | Aug. 27, 1957 |
| 2,805,968 | Dunn | Sept. 10, 1957 |
| 2,828,232 | Myer | Mar. 25, 1958 |
| 2,845,374 | Jones | July 29, 1958 |
| 2,861,018 | Fuller et al. | Nov. 18, 1958 |
| 2,898,247 | Hunter | Aug. 4, 1959 |
| 2,921,362 | Nomura | Jan. 16, 1960 |
| 2,929,751 | Blakelock | Mar. 22, 1960 |